(12) United States Patent
Cantrell

(10) Patent No.: US 11,785,736 B2
(45) Date of Patent: Oct. 10, 2023

(54) ELECTRICAL CONVEYANCE ASSEMBLY

(71) Applicant: Eaton Intelligent Power Limited, Dublin (IE)

(72) Inventor: Christopher T. Cantrell, Jackson, MI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/887,252

(22) Filed: May 29, 2020

(65) Prior Publication Data

US 2020/0383231 A1 Dec. 3, 2020

Related U.S. Application Data

(60) Provisional application No. 62/855,028, filed on May 31, 2019.

(51) Int. Cl.
| | |
|---|---|
| *H05K 7/20* | (2006.01) |
| *H05K 1/02* | (2006.01) |
| *G06K 19/07* | (2006.01) |
| *H01L 23/36* | (2006.01) |
| *B64D 15/12* | (2006.01) |
| *B29C 64/00* | (2017.01) |
| *B33Y 80/00* | (2015.01) |

(52) U.S. Cl.
CPC .............. *H05K 7/20* (2013.01); *B29C 64/00* (2017.08); *B64D 15/12* (2013.01); *G06K 19/0723* (2013.01); *H01L 23/36* (2013.01); *H05K 1/0284* (2013.01); *B33Y 80/00* (2014.12)

(58) Field of Classification Search
CPC .. H05K 7/20; H05K 7/20272; H05K 7/20772; H05K 7/20872; H05K 7/20927; H05K 1/0284; H05K 1/0272; H05K 1/0201–0212; H05K 1/181–188; H05K 2201/064; H05K 2201/10272–1028; H01L 23/46; H01L 23/50; H01L 23/473; H01L 23/34; H01L 23/36–3675; B29C 64/00; B29C 64/20–205; B29C 64/10; B64D 15/12; B33Y 80/00; G06K 19/0723
See application file for complete search history.

(56) References Cited

U.S. PATENT DOCUMENTS

| | | | | | |
|---|---|---|---|---|---|
| 4,616,102 | A | * | 10/1986 | Noorily | H01B 7/0838 174/117 FF |
| 4,744,010 | A | * | 5/1988 | Witte | H01R 33/09 361/812 |
| 5,895,889 | A | * | 4/1999 | Uchida | B60R 16/0207 174/72 A |

(Continued)

FOREIGN PATENT DOCUMENTS

| | | |
|---|---|---|
| DE | 10012950 B4 | 1/2010 |
| EP | 1870288 B1 | 9/2008 |

(Continued)

*Primary Examiner* — Amir A Jalali
(74) *Attorney, Agent, or Firm* — Merchant and Gould PC

(57) ABSTRACT

An electrical conveyance assembly includes a substrate that may include an electrically insulating material. The electrical conveyance assembly may include a plurality of electrical conductors connected to the substrate via additive manufacturing. The substrate may include an internal lattice structure formed via additive manufacturing. The substrate may include an internal fluid channel.

25 Claims, 4 Drawing Sheets

(56) References Cited

U.S. PATENT DOCUMENTS

| | | | |
|---|---|---|---|
| 7,563,981 B2 | 7/2009 | Ichikawa et al. | |
| 8,563,866 B2 | 10/2013 | Oga et al. | |
| 8,858,856 B2* | 10/2014 | Kozlak | B29C 64/124 |
| | | | 264/259 |
| 9,837,191 B2* | 12/2017 | Woida-O'Brien | H01B 13/00 |
| 10,044,175 B1* | 8/2018 | Sloat | H02B 1/26 |
| 10,285,267 B2* | 5/2019 | Harple | H05K 1/0284 |
| 10,741,995 B2* | 8/2020 | Wolf | H01L 33/648 |
| 10,777,334 B2* | 9/2020 | Bilas | B60R 16/0207 |
| 10,903,415 B2* | 1/2021 | Dardona | H01L 27/20 |
| 10,919,223 B2* | 2/2021 | MacNeish | B29C 64/227 |
| 10,973,113 B2* | 4/2021 | Weis | H05K 1/185 |
| 10,980,131 B2* | 4/2021 | Kozlovski | H05K 13/0408 |
| 11,004,769 B2* | 5/2021 | Joshi | H01L 21/4871 |
| 2002/0046870 A1* | 4/2002 | Zein | H01B 7/0869 |
| | | | 174/117 F |
| 2004/0011552 A1* | 1/2004 | McKenney | H01B 7/0861 |
| | | | 174/117 F |
| 2010/0302746 A1* | 12/2010 | Wing | H05K 1/182 |
| | | | 29/829 |
| 2015/0329069 A1 | 11/2015 | Daugherty et al. | |
| 2019/0172607 A1* | 6/2019 | Bilas | H01B 13/01209 |
| 2020/0187392 A1* | 6/2020 | Joshi | H01L 23/3736 |
| 2020/0350233 A1* | 11/2020 | Mizerak | H01L 23/4735 |
| 2021/0065594 A1* | 3/2021 | Burghy | G09F 9/33 |

FOREIGN PATENT DOCUMENTS

| | | |
|---|---|---|
| GB | 2356970 B | 3/2002 |
| KR | 101154678 B1 | 6/2012 |

* cited by examiner

ELECTRICAL CONVEYANCE ASSEMBLY

CROSS-REFERENCE TO RELATED APPLICATION

This application claims the benefit of U.S. Provisional Patent Application Ser. No. 62/855,028, filed on May 31, 2019, the disclosure of which is hereby incorporated by reference in its entirety as though fully set forth herein.

TECHNICAL FIELD

The present disclosure generally relates to electrical conveyance assemblies, including electrical conveyance assemblies that may be used in connection with aircraft.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical conveyance assemblies may not be sufficiently robust, may not be designed for a wide variety of applications, and/or may involve complex assembly processes.

There is a desire for solutions/options that minimize or eliminate one or more challenges or shortcomings of electrical conveyance assemblies. The foregoing discussion is intended only to illustrate examples of the present field and should not be taken as a disavowal of scope.

SUMMARY

In embodiments, an electrical conveyance assembly may include a substrate that may include an electrically insulating material. The electrical conveyance assembly may include a plurality of electrical conductors connected to the substrate via additive manufacturing.

With embodiments, a method of forming an electrical conveyance assembly may include providing a plurality of electrical conductors. The method may include forming, via additive manufacturing, a substrate of an electrically insulating material at least partially around the plurality of electrical conductors.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
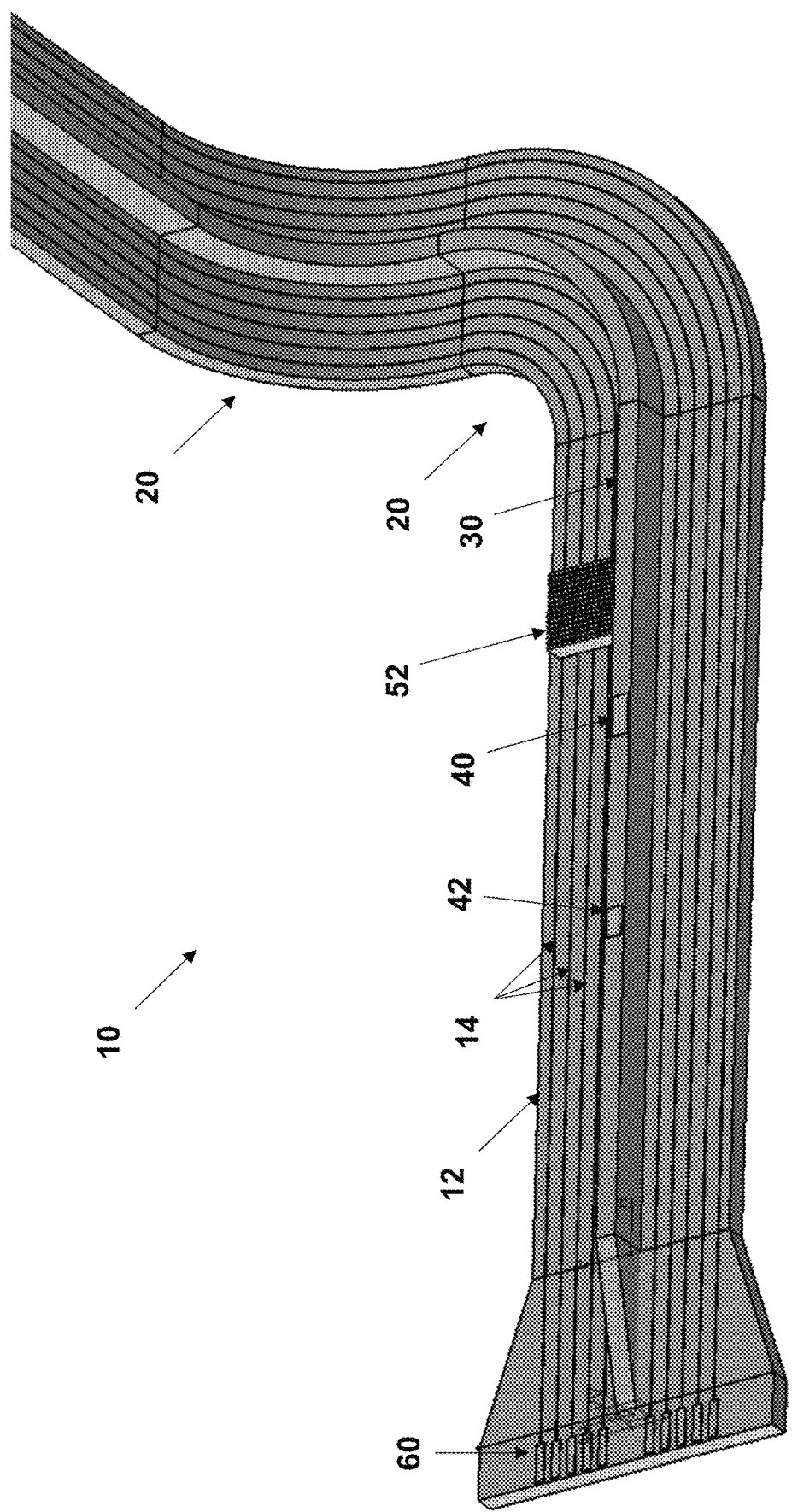
FIG. 1 is a perspective view generally illustrating an embodiment of an electrical conveyance assembly according to teachings of the present disclosure.
Figure 2:
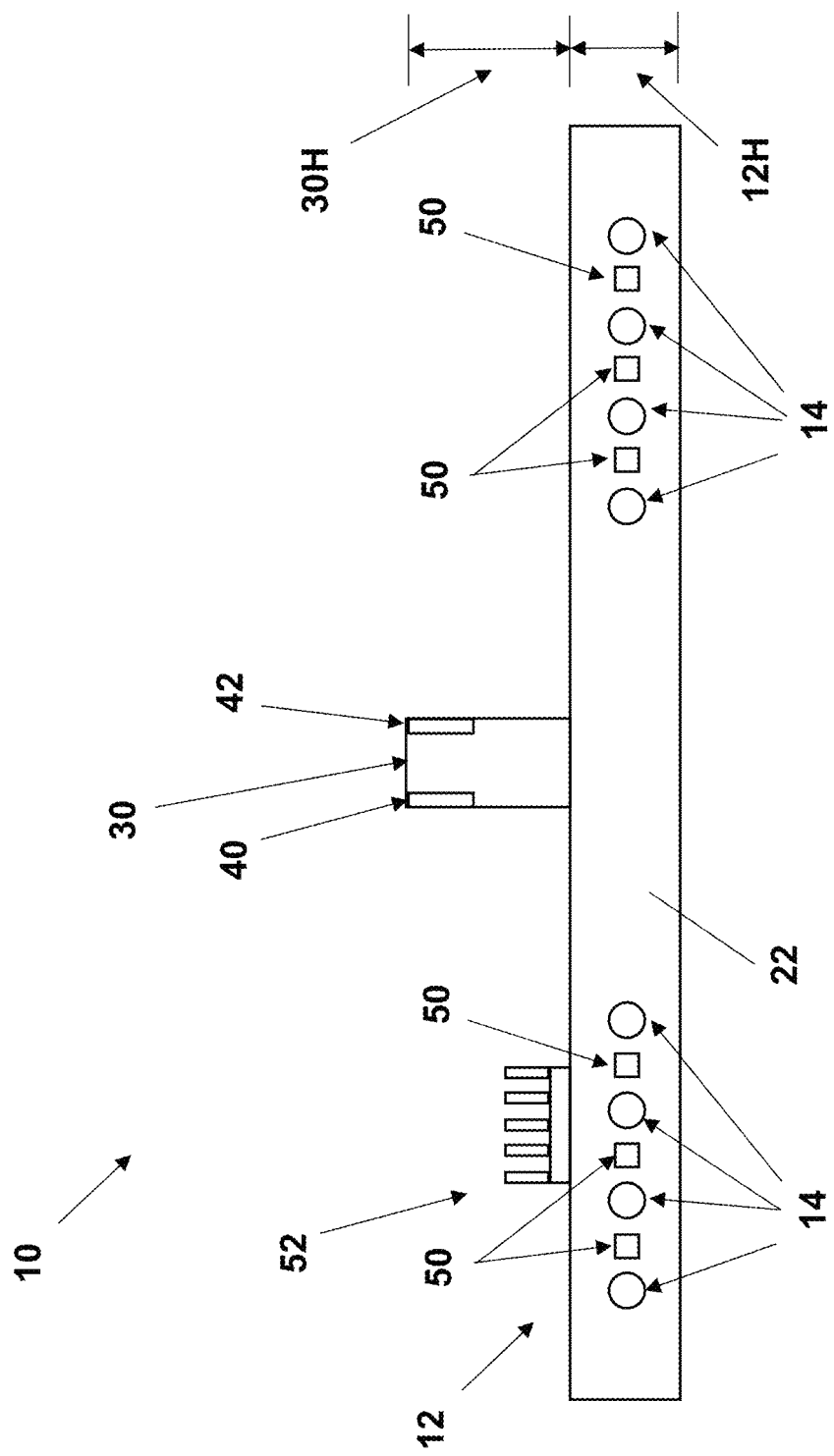
FIG. 2 is a cross-sectional view generally illustrating an embodiment of an electrical conveyance assembly according to teachings of the present disclosure.
Figure 3:
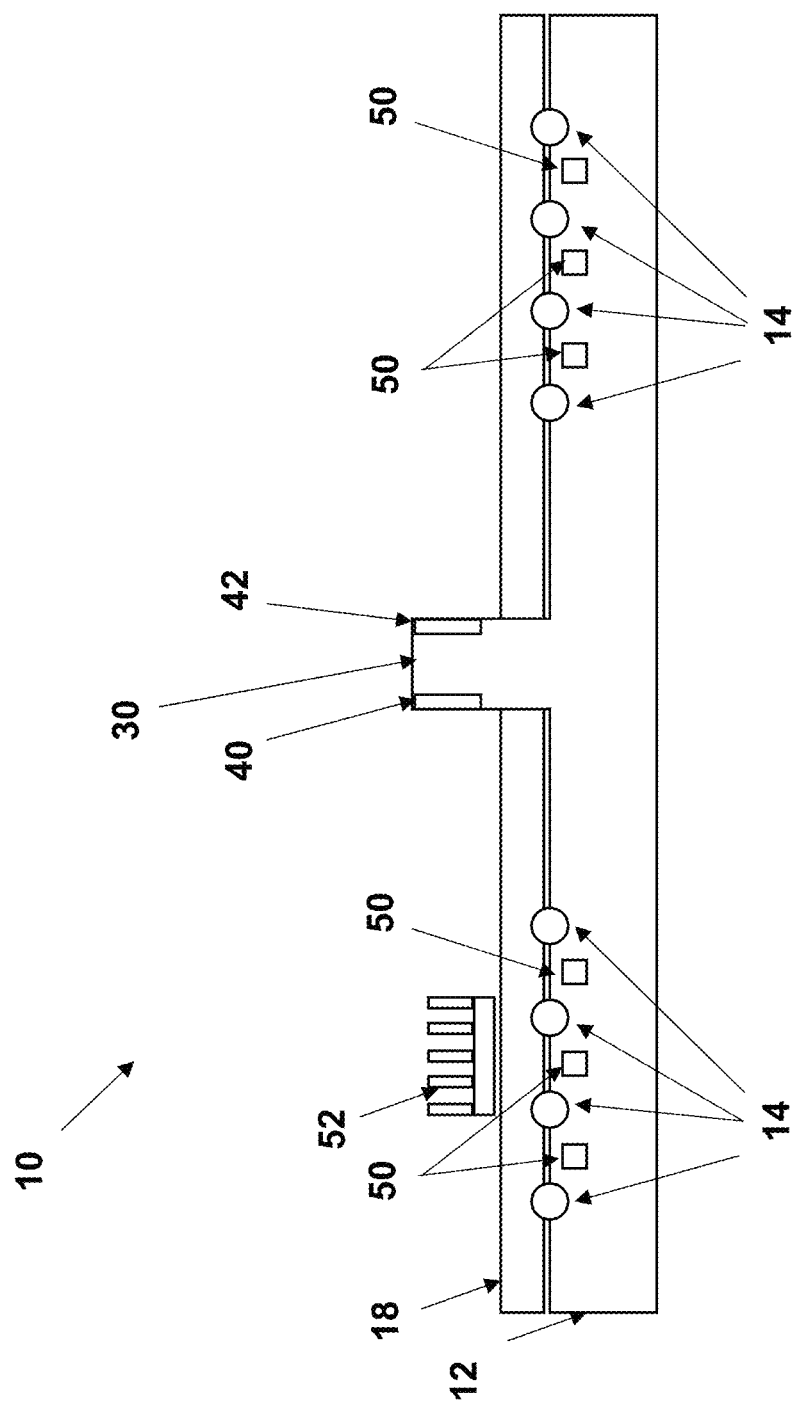
FIG. 3 is a cross-sectional view generally illustrating an embodiment of an electrical conveyance assembly according to teachings of the present disclosure.
Figure 4:
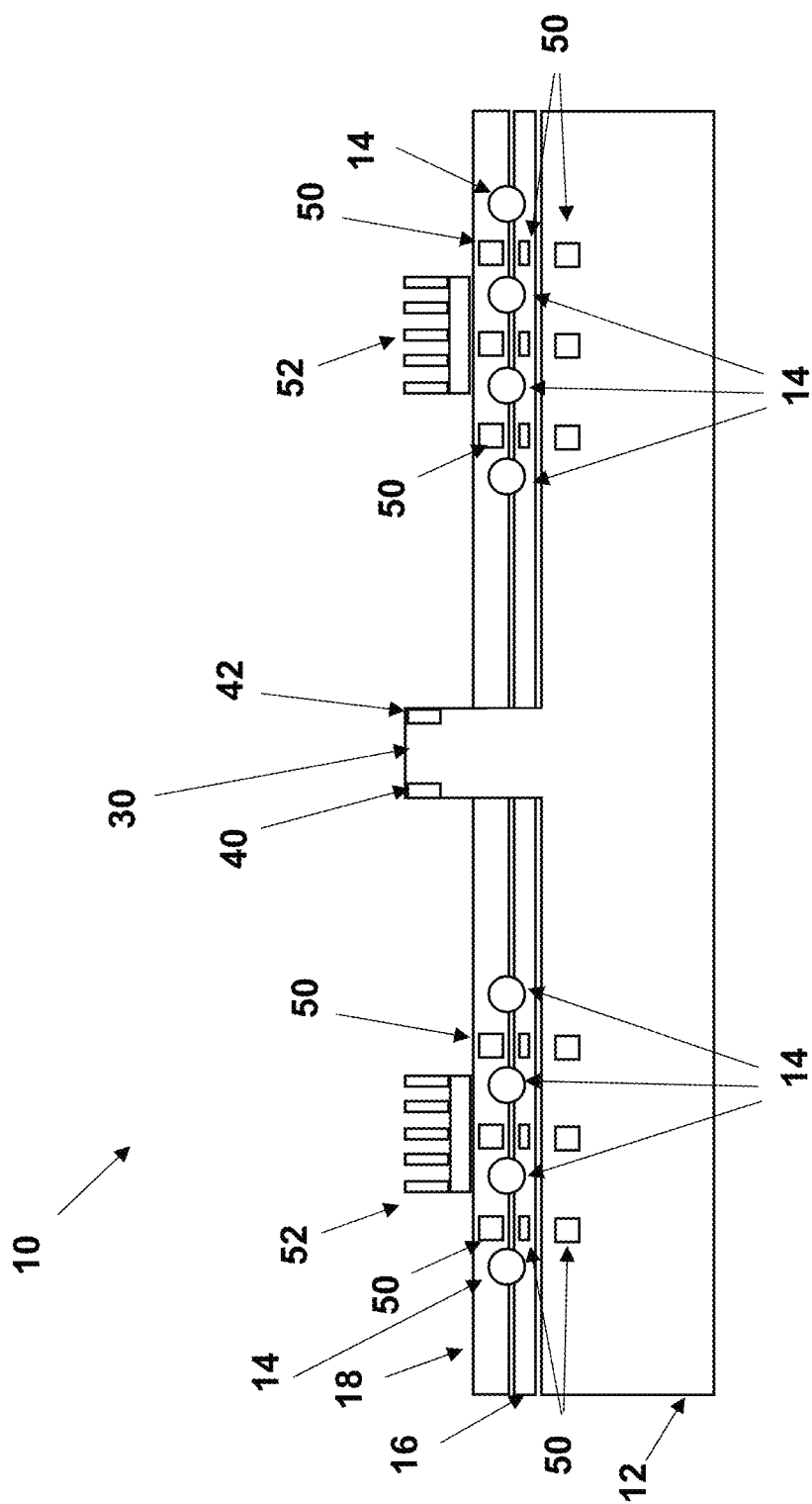
FIG. 4 is a cross-sectional view generally illustrating an embodiment of an electrical conveyance assembly according to teachings of the present disclosure.

In embodiments, such as generally illustrated in FIG. 1, an electrical conveyance assembly 10 may include a substrate 12 and/or a plurality or electrical conductors 14. The substrate 12 may include one or more of a variety of shapes, sizes, configurations, and/or materials. For example and without limitation, the substrate 12 may include an electrically insulating material, metal, and/or non-metal, the substrate 12 may include substantially planar portions, and/or the substrate 12 may include a substantially rectangular cross-sectional shape (see, e.g., FIG. 2). If the substrate 12 is not electrically conductive, the electrical conductors 14 may be connected directly with the substrate 12 (see, e.g., FIGS. 1-3). If the substrate 12 is electrically conductive (e.g., is metal, metallic, or otherwise conductive), an insulating layer 16 may be disposed at least partially between the plurality of electrical conductors 14 and the substrate 12 (see, e.g., FIG. 4). As generally illustrated in FIGS. 3 and 4, if the electrical conductors 14 are not disposed entirely in the substrate 12, the electrical conveyance assembly 10 may include a cover layer 18 to cover and/or electrically insulate the electrical conductors 14 (e.g., from above). The insulating layer 16 and/or the cover layer 18 may include an electrically insulating material.

With embodiments, such as generally illustrated in FIG. 1, the substrate 12 may include one or more bends 20 that may not be uniform. For example, bends 20 of the substrate 12 may not be constant, may not be the same as other bends, and/or may not be right angles, such as to accommodate a variety of installation configurations. As generally illustrated in FIGS. 2-4, the substrate 12 may include an internal lattice structure 22 that may be formed via additive manufacturing and/or 3-D printing, which may include forming one or more portions of the substrate 12 via a plurality of layers. A lattice structure 22 may reduce the weight of the substrate 12 while maintaining some or substantially all of the strength of the substrate 12 (e.g., compared to a solid configuration). Moreover, with embodiments, printing technology may be used to print/provide conductive paths (metal or non-metal), e.g., somewhat in the nature of a circuit board.

With embodiments, such as generally illustrated in FIGS. 1-4, a substrate 12 may include a projection or rib 30 that may extend substantially perpendicular from the substrate 12. The projection 30 may, for example and without limitation, be disposed substantially at or about the middle of the substrate 12 and/or may include a substantially rectangular cross-sectional shape. The electrical conductors 14 may be disposed on one or both sides of the projection 30. The projection 30 may increase the strength of the substrate 12. A height 30H of the projection 30 may be greater than a height 12H of the rest of the substrate 12. The projection 30 may taper toward the longitudinal end of the substrate 12 (see, e.g., FIG. 1).

In embodiments, such as generally illustrated in FIGS. 1-4, an electrical conveyance assembly 10 may include one or more sensors 40 that may be connected to the substrate 12, such as to the projection 30. A sensor 40 may be configured to sense (e.g., monitor, measure, determine, etc.) one or more of a variety of values associated with the electrical conveyance assembly 10. For example and without limitation, a sensor 40 may include a temperature sensor, a vibration sensor, and/or a strain/stress sensor, among others. The one or more sensors 40 may, with some configurations, be printed directly on and/or with the substrate 12.

With embodiments, such as generally illustrated in FIGS. 1-4, an electrical conveyance assembly 10 may include one or more identifiers 42. An identifier 42 may, for example and without limitation, include an RFID (radio frequency identification) tag and/or a transmitter/receiver that may be configured to obtain information for and/or provide information about the electrical conveyance assembly 10. An identifier 42 may be connected to the substrate 12, such as to the projection 30. The one or more identifiers 42 may, with some configurations, be printed directly on and/or with the substrate 12.

With embodiments, such as generally illustrated in FIGS. 2 and 3, the electrical conductors 14 may be connected to and/or formed with the substrate 12. For example and without limitation, the substrate 12 may be formed at least partially around the electrical conductors 14, and/or one or more electrical conductors 14 may be formed (e.g., added/printed) into and/or with the substrate 12.

In embodiments, such as generally illustrated in FIGS. 2-4, a substrate 12, an insulating layer 16, and/or a cover layer 18 may include one or more fluid channels 50 (e.g., internal fluid channels). A fluid channel 50 may, for example, be configured to provide active cooling for the electrical conveyance assembly 10 and/or the electrical conductors 14. A fluid channel 50 may be disposed in one or more of a variety of locations in a substrate 12, an insulating layer 16, and/or a cover layer 18, such as proximate one or more electrical conductors 14 and/or between two or more electrical conductors 14. A fluid channel 50 may be connected to an external fluid source that may be configured to pump fluid through the fluid channel 50 to dissipate heat, such as heat that may be generated via the one or more electrical conductors 14 (e.g., be configured for active cooling). Additionally or alternatively, one or more heat sinks 52 may be connected to the substrate 12. A heat sink 52 may be a separate component or may be formed directly on/with the substrate 12, such as via additive manufacturing. A heat sink 52 may include a thermally conductive material and/or may be configured to provide passive cooling for the electrical conveyance assembly 10.

With embodiments, such as generally illustrated in FIG. 1, an electrical conveyance assembly 10 may include one or more connectors 60. A connector 60 may be connected to an electrical conductor 14, such as at or about a longitudinal end of the electrical conductor 14. A connector 60 may, for example and without limitation, include a snap-in connector pin, which may be similar to a PCI port of a computer. Additionally or alternatively, a connector 60 may be connected to a fluid channel 50 to provide fluid cooling, such as, for example and without limitation, via a Mini-mod sold by Eaton Corporation.

Embodiments of electrical conveyance assemblies 10 may be used in connection with a wide variety of applications. For example and without limitation, an electrical conveyance assembly 10 may be used in connection with aircraft, such as for electric deicing and/or for thermoelectric energy harnessing proximate a high temperature fluid duct (e.g., the electrical conveyance assembly 10 may be configured to withstand extreme temperatures, such as temperatures above 500 degrees Fahrenheit).

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

It is intended that all matter contained in the above description or shown in the accompanying drawings shall be interpreted as illustrative only and not limiting. Changes in detail or structure may be made without departing from the present disclosure.

What is claimed is:

1. An electrical conveyance assembly, comprising:
   a substrate, the substrate including an electrically insulating material;
   a projection at a middle of the substrate, the projection being integrally formed with the substrate and extending along a longitudinal direction of the substrate;
   a plurality of electrical conductors printed with the substrate, the plurality of electrical conductors being parallel to each other and extending along the longitudinal direction of the substrate on both sides of the projection, the plurality of electrical conductors being outside of the projection; and
   an internal lattice structure within the substrate, the internal lattice structure being formed via additive manufacturing.

2. The electrical conveyance assembly of claim 1, wherein the substrate includes an internal fluid channel, the internal fluid channel being fully enclosed within the substrate and formed via additive manufacturing.

3. The electrical conveyance assembly of claim 2, wherein the internal fluid channel is configured to provide active cooling for at least one electrical conductor of the plurality of electrical conductors.

4. The electrical conveyance assembly of claim 1, including a sensor integrally formed with the substrate.

5. The electrical conveyance assembly of claim 4, wherein the sensor includes a temperature sensor, a strain sensor, and/or a vibration sensor.

6. The electrical conveyance assembly of claim 1, including a heatsink connected to the substrate.

7. The electrical conveyance assembly of claim 6, wherein the heatsink is formed via additive manufacturing.

8. The electrical conveyance assembly of claim 1, wherein an identifier is connected to the substrate.

9. The electrical conveyance assembly of claim 8, wherein the identifier includes an RFID tag integrally formed with the substrate.

10. The electrical conveyance assembly of claim 1, including a snap-in connector pin connected to an electrical conductor of the plurality of electrical conductors.

11. The electrical conveyance assembly of claim 1, including a layer of insulation disposed over the substrate such that at least one electrical conductor of the plurality of electrical conductors is disposed at least partially between a portion of the substrate and the layer of insulation.

12. The electrical conveyance assembly of claim 1, wherein:
   the projection comprises a taper at an end of the substrate.

13. The electrical conveyance assembly of claim 1, wherein a height of the projection is greater than a height of the substrate.

14. The electrical conveyance assembly of claim 1, further comprising a heat sink on the substrate on one side of the projection.

15. A method of forming an electrical conveyance assembly, the method comprising:
   forming, via additive manufacturing, a substrate of an electrically insulating material, wherein forming the substrate includes forming an internal lattice structure and forming a projection at a middle of the substrate, the projection being integrally formed with the substrate and extending along a longitudinal direction of the substrate; and
   printing a plurality of electrical conductors with the substrate, the electrical conductors being parallel to each other and extending along the longitudinal direction of the substrate on both sides of the projection, wherein the substrate is formed at least partially around the plurality of electrical conductors, and wherein the plurality of electrical conductors are outside of the projection.

16. The method of claim 15, wherein forming the substrate includes forming one or more internal fluid channels configured for active cooling of at least one electrical conductor of the plurality of electrical conductors, the one or more internal fluid channels being fully enclosed within the substrate and formed via additive manufacturing.

17. The method of claim 15, wherein forming the substrate includes forming the substrate at least partially around an identifier and/or a sensor.

18. The method of claim 15, including forming, via additive manufacturing, a heatsink on a surface of the substrate.

19. The method of claim 15, wherein forming the substrate includes providing the substrate with a substantially rectangular cross-sectional shape and providing the substrate with a plurality of non-uniform bends.

20. The method of claim 15, wherein the substrate is formed to be compatible with aircraft loading, temperatures, and vibrations.

21. The method of claim 15, wherein forming the projection comprises forming a taper to the projection at an end of the substrate in a longitudinal direction thereof.

22. The method of claim 15, wherein forming the projection comprises forming the projection with a height that is greater than a height of the substrate.

23. The method of claim 15, further comprising forming a heat sink on the substrate on one side of the projection.

24. An electrical conveyance assembly, comprising:
   a substrate, the substrate including an electrically insulating material;
   a projection at a middle of the substrate, the projection being integrally formed with the substrate and extending along a longitudinal direction of the substrate;
   a plurality of electrical conductors printed with the substrate, the plurality of electrical conductors being parallel to each other and extending along the longitudinal direction of the substrate on both sides of the projection;
   an internal lattice structure within the substrate, the internal lattice structure being formed via additive manufacturing; and at least one of:
   a sensor affixed to a first portion of the projection; and
   an identifier affixed to a second portion of the projection.

25. A method of forming an electrical conveyance assembly, the method comprising:
   forming, via additive manufacturing, a substrate of an electrically insulating material, wherein forming the substrate includes forming an internal lattice structure and forming a projection at a middle of the substrate, the projection being integrally formed with the substrate and extending along a longitudinal direction of the substrate; and
   printing a plurality of electrical conductors with the substrate, the electrical conductors being parallel to each other and extending along the longitudinal direction of the substrate on both sides of the projection, wherein the substrate is formed at least partially around the plurality of electrical conductors;

wherein forming the projection comprises forming at least one of:
a sensor affixed to a first portion of the projection; and
an identifier affixed to a second portion of the projection.

* * * * *